(12) United States Patent
Lee et al.

(10) Patent No.: US 11,956,890 B2
(45) Date of Patent: Apr. 9, 2024

(54) CIRCUIT BOARD AND SEMICONDUCTOR MODULE

(71) Applicant: SAMSUNG ELECTRONICS CO., LTD., Suwon-si (KR)

(72) Inventors: Yunho Lee, Yongin-si (KR); Yoojeong Kwon, Hwaseong-si (KR); Kyoungsun Kim, Uijeongbu-si (KR); Dongyeop Kim, Hwaseong-si (KR); Sungjoo Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 17/720,364

(22) Filed: Apr. 14, 2022

(65) Prior Publication Data
US 2023/0066722 A1   Mar. 2, 2023

(30) Foreign Application Priority Data
Aug. 27, 2021  (KR) .................. 10-2021-0113962

(51) Int. Cl.
| | | |
|---|---|---|
| *H05K 1/02* | (2006.01) | |
| *H01P 3/08* | (2006.01) | |
| *H05K 1/11* | (2006.01) | |
| *H05K 1/18* | (2006.01) | |
| *G11C 11/401* | (2006.01) | |
| *G11C 16/04* | (2006.01) | |

(52) U.S. Cl.
CPC .......... *H05K 1/0245* (2013.01); *H01P 3/088* (2013.01); *H05K 1/115* (2013.01); *H05K 1/181* (2013.01); *G11C 11/401* (2013.01); *G11C 16/0483* (2013.01); *H05K 2201/10159* (2013.01)

(58) Field of Classification Search
CPC ..... H05K 1/0245; H05K 1/115; H05K 1/0228
See application file for complete search history.

(56) References Cited

U.S. PATENT DOCUMENTS

| | | | |
|---|---|---|---|
| 5,357,051 A * | 10/1994 | Hwang | ............... H05K 1/0228 |
| | | | 174/250 |
| 6,514,090 B1 | 2/2003 | Neal et al. | |
| 7,102,455 B2 | 9/2006 | Lin et al. | |
| 7,986,495 B2 | 7/2011 | Kamei et al. | |
| 8,058,557 B2 | 11/2011 | Liu et al. | |
| 9,930,772 B2 | 3/2018 | Morgan et al. | |
| 10,383,213 B1 | 8/2019 | Chengson et al. | |
| 10,607,952 B2 | 3/2020 | Sutono | |
| 2004/0178861 A1 | 9/2004 | Apel | |

(Continued)

*Primary Examiner* — Sherman Ng
(74) *Attorney, Agent, or Firm* — Fish & Richardson P.C.

(57) ABSTRACT

A circuit board includes a first insulating layer; a first wiring pattern and a second wiring pattern each formed to be side to side with each other on an upper surface of the first insulating layer; a second insulating layer formed on the upper surface of the first insulating layer to cover the first and second wiring patterns; a third wiring pattern formed on an upper surface of the second insulating layer to overlap the first wiring pattern in a vertical direction; a fourth wiring pattern formed on the upper surface of the second insulating layer to overlap the second wiring pattern in the vertical direction; a first via passing through the second insulating layer and connecting the first and fourth wiring patterns; and a second via passing through the second insulating layer and connecting the second and third wiring patterns.

14 Claims, 19 Drawing Sheets

(56) References Cited

U.S. PATENT DOCUMENTS

| | | | |
|---|---|---|---|
| 2013/0111745 A1* | 5/2013 | Ao | H05K 1/0251 29/837 |
| 2015/0229016 A1 | 8/2015 | Biddle | |
| 2016/0172016 A1* | 6/2016 | Matsumoto | G06F 11/1076 365/191 |
| 2016/0311387 A1 | 10/2016 | Van Buskirk et al. | |
| 2017/0303391 A1* | 10/2017 | Miyasaka | H05K 1/0245 |
| 2018/0177043 A1* | 6/2018 | Li | H05K 1/0245 |

* cited by examiner

I-I'

CIRCUIT BOARD AND SEMICONDUCTOR MODULE

CROSS-REFERENCE TO RELATED APPLICATION

This application claims benefit of priority to Korean Patent Application No. 10-2021-0113962 filed on Aug. 27, 2021, in the Korean Intellectual Property Office, the disclosure of which is incorporated herein by reference in its entirety.

BACKGROUND

1. Field

Embodiments relate to a circuit board and a semiconductor module.

2. Description of the Related Art

A circuit board for electrically connecting semiconductor devices may be manufactured to have a multilayer structure, in order to transmit various types of transmission signals according to a high degree of integration of semiconductor devices.

SUMMARY

According to an embodiment, a circuit board includes a first insulating layer; a first wiring pattern and a second wiring pattern each formed to be side to side with each other on an upper surface of the first insulating layer; a second insulating layer formed on the upper surface of the first insulating layer to cover the first and second wiring patterns; a third wiring pattern formed on an upper surface of the second insulating layer to overlap the first wiring pattern in a vertical direction; a fourth wiring pattern formed on the upper surface of the second insulating layer to overlap the second wiring pattern in the vertical direction; a first via passing through the second insulating layer and connecting the first and fourth wiring patterns; and a second via passing through the second insulating layer and connecting the second and third wiring patterns.

According to an embodiment, a circuit board includes a first via and a second via each passing through an insulating layer; at least one first upper wiring pattern and at least one first lower wiring pattern, connected to the first via; and at least one second upper wiring pattern and at least one second lower wiring pattern, connected to the second via, wherein the at least one first upper wiring pattern and at least one second upper wiring pattern are alternately disposed on an upper surface of the insulating layer, the at least one first lower wiring pattern is disposed on a lower surface of the insulating layer to overlap the at least one second upper wiring pattern in a vertical direction, and the at least one second lower wiring pattern is disposed on the lower surface of the insulating layer to overlap the at least one first upper wiring pattern in the vertical direction.

According to an embodiment, a semiconductor module includes a memory device storing data; a controller controlling the memory device; a circuit board on which the memory device and the controller are mounted; and a first differential signal transmission circuit formed on the circuit board to connect the controller and the memory device, wherein the first differential signal transmission circuit includes a plurality of input wiring patterns and a plurality of complementary wiring patterns, alternately arranged on an upper surface and a lower surface of an insulating layer, wherein the plurality of input wiring patterns are connected to a common input wiring pattern at both ends of the first differential signal transmission circuit, and the plurality of complementary wiring patterns are connected to a common complementary wiring pattern at the both ends of the first differential signal transmission circuit.

BRIEF DESCRIPTION OF DRAWINGS

Features will become apparent to those of skill in the art by describing in detail example embodiments with reference to the attached drawings in which.

DETAILED DESCRIPTION

Figure 1:
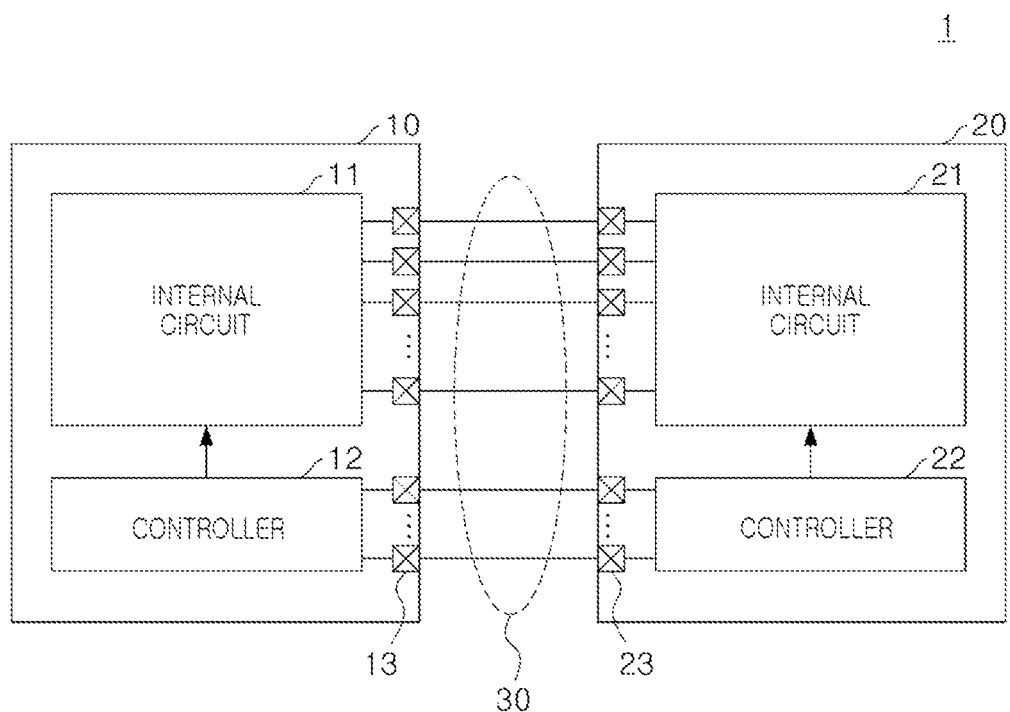
FIG. 1 is a block diagram schematically illustrating a system including a semiconductor device according to an example embodiment.

FIG. 1 is a block diagram schematically illustrating a system including a semiconductor device according to an example embodiment.

Referring to FIG. 1, a system 1 according to an example embodiment may include a first semiconductor device 10 and a second semiconductor device 20.

The first semiconductor device 10 and the second semiconductor device 20 may be connected to communicate with each other.

The first semiconductor device 10 may include an internal circuit 11 and a controller 12. The second semiconductor device 20 may include an internal circuit 21 and a controller 22.

In an example embodiment, the first semiconductor device 10 and the second semiconductor device 20 may perform different functions. For example, when the first semiconductor device 10 is an application processor, the internal circuit 11 may include a CPU, a GPU, a DSP, an NPU, a memory interface, a display interface, a power circuit, or the like. When the second semiconductor device 20 is a memory device or a memory module connected to an application processor, the internal circuit 21 may include a memory cell array in which memory cells are disposed, and peripheral circuits controlling the memory cell array. The controller 22 may control the internal circuit 21.

The first semiconductor device 10 and the second semiconductor device 20 may transmit and receive signals through a plurality of transmission lines 30 that connect pads 13 and 23.

The signals transmitted and received between the first semiconductor device 10 and the second semiconductor device 20 may include a differential signal. For example, the controller 12 may transmit a differential clock signal to the second semiconductor device 20 to control an operation of the second semiconductor device 20. A differential clock signal received from the first semiconductor device 10 may be transmitted to the controller 22 through the pad 23. The controller 22 may buffer the differential clock signal, and provide the buffered differential clock signal to the internal circuit 21 to control an operation of the internal circuit 21.

The differential signal received from the pad 23 may be transmitted to the internal circuit 21 and the controller 22 through wiring patterns formed on a printed circuit board (PCB) on which the internal circuit 21 and the controller 22 are mounted, or the like.

To provide fast semiconductor devices, a differential clock signal transmitted through wiring patterns may have a high frequency. In order to transmit a differential signal having a high frequency without loss of signal integrity, wiring patterns having reduced characteristic impedance values may be used. In addition, in order to meet the trend for a high degree of integration of semiconductor devices, wiring patterns capable of generating less interference in signals transmitted through adjacent wiring patterns may be used.

According to an example embodiment, a differential signal transmission circuit formed on a circuit board may include a plurality of input wiring patterns provided to transmit the same input signal and a plurality of complementary wiring patterns provided to transmit a complementary signal of the input signal. The plurality of input wiring patterns and the plurality of complementary wiring patterns may be alternately disposed on an upper surface and a lower surface of an insulating layer.

According to an example embodiment, since each of the plurality of input wiring patterns and the plurality of complementary wiring patterns may be coupled on the upper and lower surfaces, and a side surface of the insulating layer, characteristic impedance values of the differential signal transmission circuit may be reduced. In addition, interference of the differential signal transmission circuit with respect to adjacent wiring patterns of the plurality of input wiring patterns and the plurality of complementary wiring patterns, alternately arranged, may be alleviated, and various wiring patterns may be integrated on the circuit board.

Figure 2:
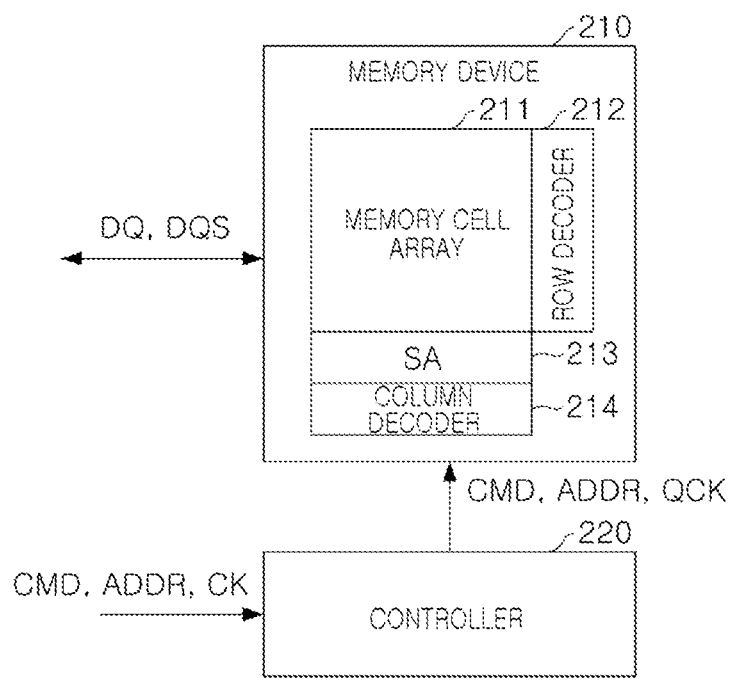
FIGS. 2 and 3 are views schematically illustrating a semiconductor module according to an example embodiment.
Figure 3:
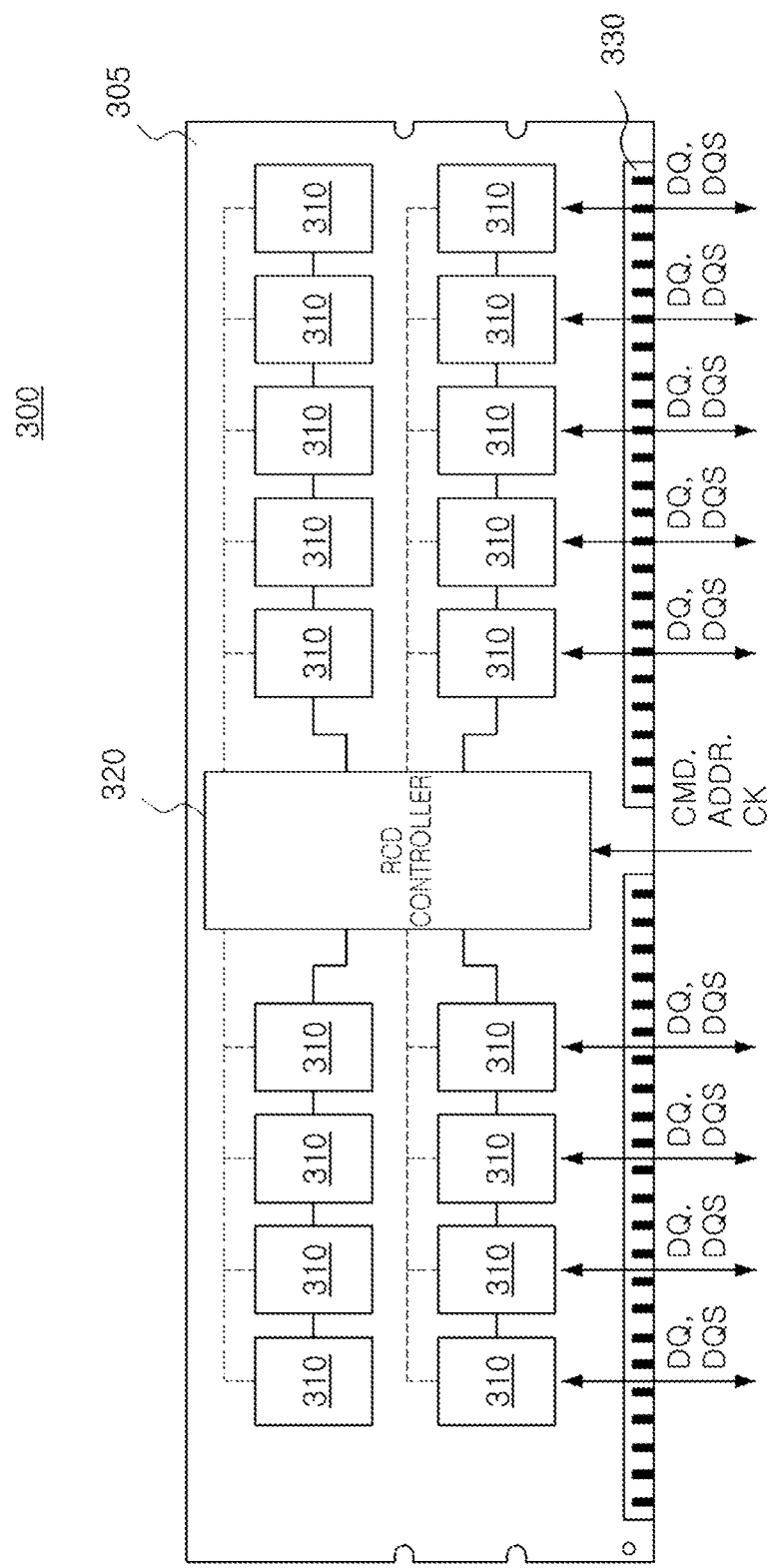

FIGS. 2 and 3 are views schematically illustrating a semiconductor module according to an example embodiment.

A semiconductor module 200 of FIG. 2 may correspond to the second semiconductor device 20 described with reference to FIG. 1.

Referring to FIG. 2, the semiconductor module 200 may include a memory device 210 and a controller 220.

The memory device 210 may include a memory cell array 211, a row decoder 212, a sense amplifier 213, and a column decoder 214.

The controller 220 may buffer a command CMD, an address ADDR, and a clock signal CK, provided from an external device. In addition, the controller 220 may provide the buffered command CMD and the buffered address ADDR to the memory device 210, and may provide the buffered clock signal CK as an output clock signal QCK for controlling an operation of the memory device 210 to the memory device 210.

The memory device 210 may transmit and receive a data signal DQ and a data strobe signal DQS with an external device through a main channel. For example, the main channel may include at least one of a double data rate (DDR), a DDR2, a DDR3, a DDR4, a low power DDR (LPDDR), a universal serial bus (USB), a multimedia card (MMC), an embedded MMC, a peripheral component interconnection (PCI), a PCI-express (PCI-E), an advanced technology attachment (ATA), a serial-ATA, a parallel-ATA, a small computer small interface (SCSI), an enhanced small disk interface (ESDI), integrated drive electronics (IDE), a firewire, a universal flash storage (UFS), or a non-volatile memory express (NVMe).

A signal received by the semiconductor module 200 through the main channel may be transmitted to the memory device 210 through a printed circuit board on which the memory device 210 and the controller 220 are mounted. Also, a signal provided to the memory device 210 by the controller 220 may be transmitted through the printed circuit board, e.g., between one end and another end of a differential signal transmission circuit according to an example embodiment.

Referring to FIG. 3, a semiconductor module 300 may include a plurality of memory devices 310, a registering clock driver (RCD) controller 320, and a signal pin 330. The memory device 310, the RCD controller 320, and the signal pin 330 may be mounted on a module substrate 305. The signal pin 330 may be provided as a plurality of signal pins. The module substrate 305 may be implemented as a printed circuit board.

Each of the memory devices 310 may correspond to the memory device 210 described with reference to FIG. 2. The memory device 310 may receive a data signal DQ and a data strobe signal DQS, received from an external device through the signal pin 330, through wiring patterns of the module substrate 305. In addition, the data signal DQ and the data strobe signal DQS, transmitted from the memory device 310 to the signal pin 330 through the wiring patterns, may be provided to an external device.

The RCD controller 320 may correspond to the controller 220 described with reference to FIG. 2. The RCD controller 320 may transmit a command CMD, an address ADDR, and a clock signal CK, received from an external device and buffered, to each of the memory devices 310 through wiring patterns of the module substrate 305. A clock signal provided from the RCD controller 320 to the memory device 310 may be referred to as an output clock signal QCK. As illustrated in FIG. 3, a dashed line illustrates a wiring pattern transmitting the output clock signal QCK, and a solid line illustrates a wiring pattern transmitting the command CMD and the address ADDR.

At least some of signals transmitted and received between the memory device 310, the RCD controller 320, and the signal pin 330 may be transferred as differential signals. For example, the output clock signal QCK and the data strobe signal DQS may be transferred as differential signals.

According to an example embodiment, a differential signal transmission circuit for transmitting a differential signal may include a plurality of input wiring patterns and a plurality of complementary wiring patterns, alternately disposed on upper and lower surfaces of an insulating layer.

Figure 4:
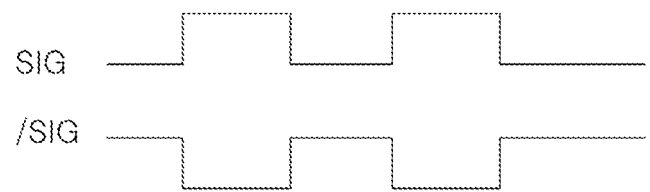
FIG. 4 is a view illustrating a differential signal.

FIG. 4 is a view illustrating a differential signal.

A differential signal may include an input signal SIG and a complementary signal/SIG. The input signal SIG and the complementary signal/SIG may have the same amplitude and opposite phases.

Common mode noise may be included in the input signal SIG and the complementary signal/SIG, transmitted through adjacent signal lines. When the input signal SIG and the complementary signal/SIG are used, a signal in which the common mode noise is canceled out may be obtained.

Figure 5A:
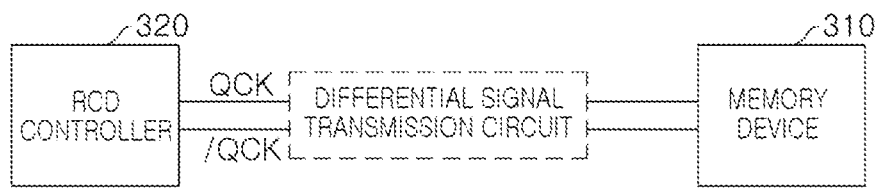
FIGS. 5A and 5B are views schematically illustrating a differential signal transmission circuit included in a semiconductor device according to an example embodiment.
Figure 5B:
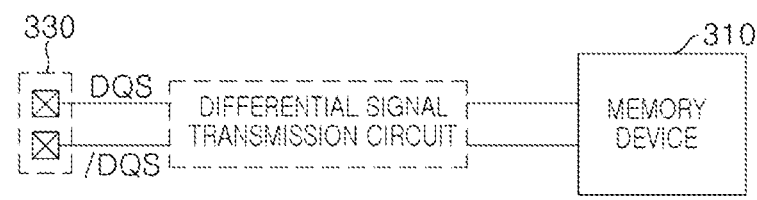

FIGS. 5A and 5B are views schematically illustrating a differential signal transmission circuit included in a semiconductor device according to an example embodiment.

Referring to FIG. 5A, an RCD controller 320 and a memory device 310 of FIG. 5A may correspond to the RCD controller 320 and the memory device 310 described with reference to FIG. 3. The RCD controller 320 may transmit an output clock signal QCK and a complementary signal/QCK to the memory device 310 through a differential signal transmission circuit printed on a module substrate 305.

Referring to FIG. 5B, a signal pin 330 and a memory device 310 of FIG. 5B may correspond to the signal pin 330 and the memory device 310 described with reference to FIG. 3. The signal pin 330 may transmit a data strobe signal DQS and a complementary signal/DQS, received from the external device, to the memory device 310 through a differential signal transmission circuit of the module substrate 305.

In response to a trend toward higher performance of semiconductor devices, a differential signal transmission circuit may be used to transmit a differential signal at high speed, e.g., high frequency.

In general, the stronger that coupling is between an input wiring pattern for transmitting an input signal and a complementary wiring pattern for transmitting a complementary signal on a circuit board, the lower a characteristic impedance value is of the differential signal transmission circuit. Thus, as characteristic impedance values of a differential signal transmission circuit are lowered, a higher-frequency differential signal may be transmitted without loss of signal integrity.

Also in general, as an area on which an input wiring pattern and a complementary wiring pattern face each other is increased, the more strongly coupled the input wiring pattern and the complementary wiring pattern may be. Also, as a line width of the input wiring pattern and a line width of the complementary wiring pattern become wider, a larger amount of signal energy may be emitted to a surrounding region through the wiring patterns, and a differential signal may cause stronger interference with other signals transmitted through adjacent wiring patterns.

According to an example embodiment, a differential signal transmission circuit may include a plurality of input wiring patterns and a plurality of complementary wiring patterns. The plurality of input wiring patterns and the plurality of complementary wiring patterns may be connected to a common input wiring pattern and a common complementary wiring pattern through vias at both or opposite ends of the differential signal transmission circuit, respectively. At the both ends of the differential signal transmission circuit, the common input wiring pattern and the common complementary wiring pattern may be connected to semiconductor devices mounted on a circuit board, for example, a device such as a memory device 310, an RCD controller 320, or a signal pin 330.

A plurality of input wiring patterns and a plurality of complementary wiring patterns may be alternately arranged on an upper surface and a lower surface of an insulating layer. For example, at least one upper input wiring pattern and at least one upper complementary wiring pattern may be alternately arranged on the upper surface of the insulating layer, a lower input wiring pattern may be disposed to face the upper complementary wiring patterns on the lower surface of the insulating layer, and a lower complementary wiring pattern may be disposed to face the upper input wiring pattern.

According to an example embodiment, a plurality of input wiring patterns and a plurality of complementary wiring patterns included in a differential signal transmission circuit may be coupled in the vertical direction and in the lateral direction. Therefore, the wiring patterns may be strongly coupled even when a line width of each of the wiring patterns is not increased. Therefore, characteristic impedance values of the differential signal transmission circuit may be lowered, and a high-frequency differential signal may be transmitted from a circuit board without loss thereof. Also, since the line width of each of the wiring patterns is not widened, interference with an adjacent signal may be alleviated, and various wiring patterns may effectively be disposed on the circuit board.

FIGS. 6 to 17 are views illustrating a differential signal transmission circuit according to an example embodiment.

Figure 6:
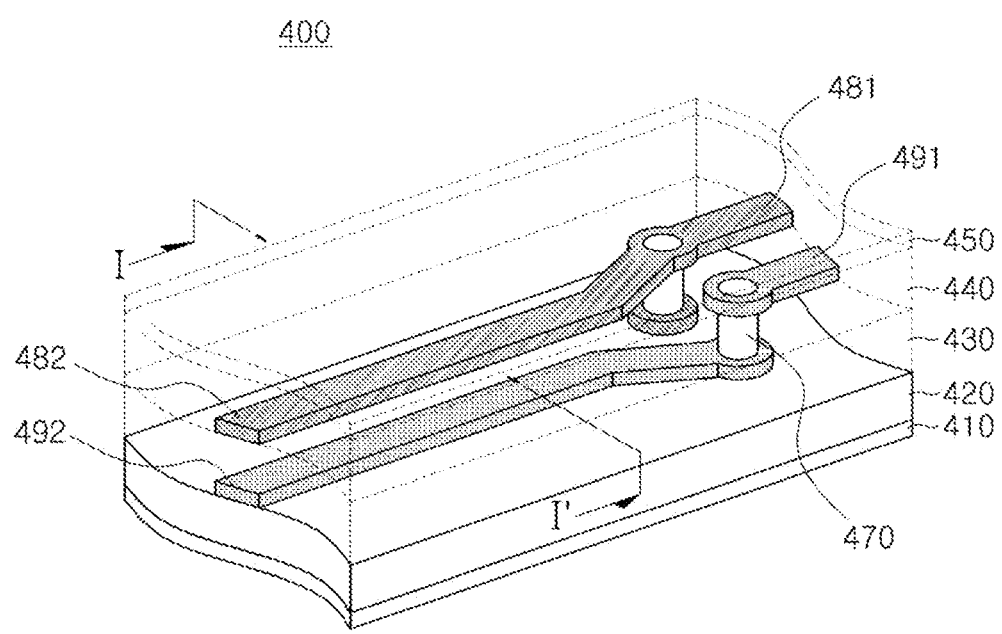
FIGS. 6 to 8 are views illustrating a differential signal transmission circuit according to a comparative example.
Figure 7:
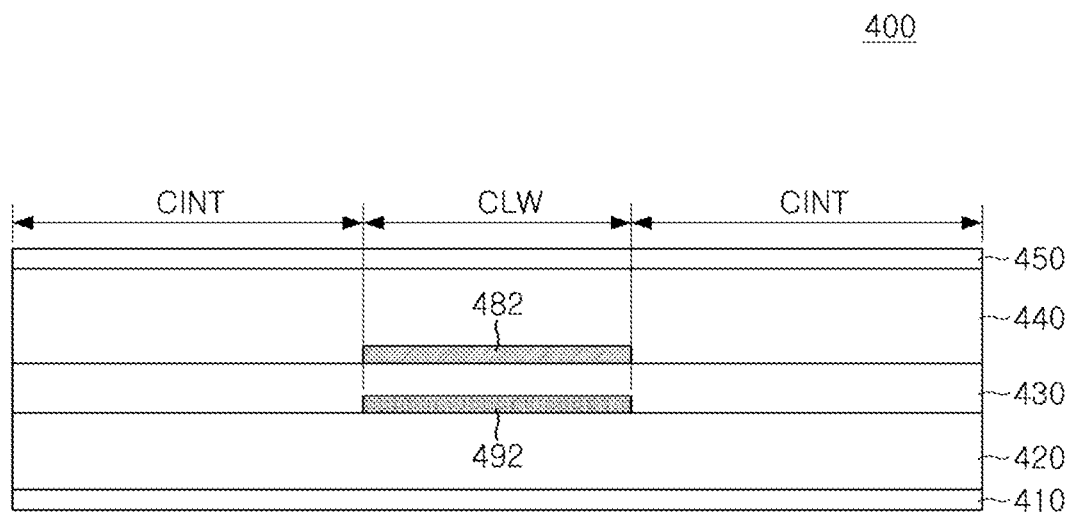
Figure 8:
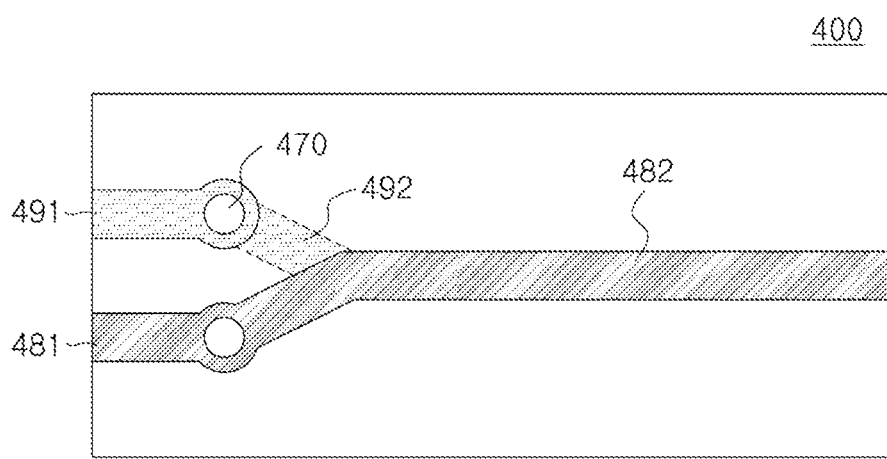

FIGS. 6 to 8 are views illustrating a differential signal transmission circuit according to a comparative example.

As will be described in detail in connection with FIGS. 6 to 8, according to the comparative example, a differential signal transmission circuit may include an upper wiring pattern provided to transmit an input signal from an upper surface of an insulating layer, and a lower wiring pattern provided to transmit a complementary signal of the input signal from a lower surface of the insulating layer. The upper wiring pattern and the lower wiring pattern may be connected to an input wiring pattern and a complementary wiring pattern through vias provided at both ends of the differential signal transmission circuit, respectively, and the input wiring pattern and the complementary wiring pattern at the both ends of the differential signal transmission circuit may be connected to semiconductor devices mounted on a circuit board.

FIG. 6 is a perspective view illustrating one end of a differential signal transmission circuit wired on a circuit board, according to the comparative example. FIG. 7 is a cross-sectional view of the circuit board of FIG. 6, taken along line I-I', and FIG. 8 is a plan view of the circuit board of FIG. 6.

Referring to FIGS. 6 and 7, a circuit board 400 including a differential signal transmission circuit, according to the comparative example, may include a power plane 410, first to third insulating layers 420, 430, and 440, and a ground plane 450.

The power plane 410 may be referred to as a metallized layer, and the power plane 410 may be connected to a power source. In the printed circuit board, a level of the power source may be 5 or 12 volts, but the power source may have any level depending on a circuit. The first insulating layer 420 may be formed on an upper surface of the power plane 410. A lower wiring pattern 492 may be formed on an upper surface of the first insulating layer 420. The second insulating layer 430 may be formed to cover the lower wiring pattern 492 on the upper surface of the first insulating layer 420. An upper wiring pattern 482 may be formed on an upper surface of the second insulating layer 430. The third insulating layer 440 may be formed to cover the upper wiring pattern 482 on the upper surface of the second insulating layer 430. The ground plane 450 may be formed on an upper surface of the third insulating layer 440. The ground plane 450 may be referred to as a metallized layer, like the power plane 410, and the ground plane 450 may be electrically coupled to a ground signal or a reference signal.

Referring to FIGS. 7 and 8, the upper wiring pattern 482 may be formed to overlap the lower wiring pattern 492 in the vertical direction. In addition, the upper wiring pattern 482 and the lower wiring pattern 492 may extend while having a constant line width. A line width of the upper wiring pattern 482 may be the same as a line width of the lower wiring pattern 492, and in FIG. 7, these line widths may be referred to as a comparison line width CLW.

Referring to FIGS. 6 and 8, the differential signal transmission circuit may further include a first wiring pattern 481 and a second wiring pattern 491 formed on the upper surface of the second insulating layer 430. The first wiring pattern 481 and the second wiring pattern 491 may be connected to a semiconductor device mounted on the circuit board 400.

In addition, the differential signal transmission circuit may further include a via 470, passing through the second insulating layer 430. The lower wiring pattern 492 may be connected to the second wiring pattern 491 through the second via 470. The upper wiring pattern 482 may be connected to the first wiring pattern 481 on the upper surface of the second insulating layer 430. The upper wiring pattern 482 and the first wiring pattern 481 may be connected with a via interposed therebetween, but are not limited thereto.

In the differential signal transmission circuit, the upper wiring pattern 482 may be provided to transmit an input signal, and the lower wiring pattern 492 may be provided to transmit a complementary signal of the input signal. Specifically, the input signal may be transmitted from the semiconductor device mounted on the circuit board 400 to the upper wiring pattern 482 through the first wiring pattern 481. In addition, the complementary signal may be transmitted from the semiconductor device to the lower wiring pattern 492 through the second wiring pattern 491. The upper wiring pattern 482 and the lower wiring pattern 492 may be electrically coupled to transmit a differential signal.

According to the comparative example, when the upper wiring pattern 482 and the lower wiring pattern 492 overlap in the vertical direction, an area occupied by the differential signal transmission circuit in the circuit board 400 may be reduced, compared to a case in which wiring patterns are arranged side by side horizontally.

As electrical coupling between the wiring patterns of the differential signal transmission circuit is strengthened, characteristic impedance values of the differential signal transmission circuit may be reduced, and a differential signal having a high frequency may be transmitted without loss thereof. As a line width in which the upper wiring pattern 482 and the lower wiring pattern 492 overlap increases, coupling of the wiring patterns may be strengthened.

When the comparison line width CLW is widened (to widen a line width in which the upper wiring pattern 482 and the lower wiring pattern 492 overlap), characteristic impedance values of the differential signal transmission circuit may be reduced. However, when line widths of the wiring patterns increase, signal energy may be emitted to a surrounding region through wiring patterns having a large area, and the emitted signal energy may interfere with other signals transmitted through adjacent wiring patterns.

In order to prevent the above-described interference with other signals, a sufficient interval should be secured between differential signal wiring patterns transmitting a differential signal and adjacent wiring patterns. For example, the differential signal wiring patterns and the adjacent wiring patterns may be disposed to be spaced apart from each other by a comparison wiring interval CINT, where CINT is equal to twice the comparison line width CLW. As such, according to the comparative example, it may be difficult to effectively integrate various wiring patterns on the circuit board 400.

As will be described in further detail below, according to example embodiments, a differential signal transmission circuit may include first and second upper wiring patterns alternately arranged on an upper surface of an insulating layer, and first and second lower wiring patterns alternately arranged on a lower surface of the insulating layer. The first upper wiring pattern and the first lower wiring pattern may be provided to transmit an input signal, and the second upper wiring pattern and the second lower wiring pattern may be provided to transmit a complementary signal of the input signal. In addition, the first upper wiring pattern and the second lower wiring pattern may overlap in the vertical direction, and the second upper wiring pattern and the first lower wiring pattern may overlap in the vertical direction.

According to example embodiments, wiring patterns transmitting an input signal and wiring patterns transmitting a complementary signal may be coupled in the vertical direction and in the lateral direction. Thus, coupling of the wiring patterns may be improved.

Figure 9:
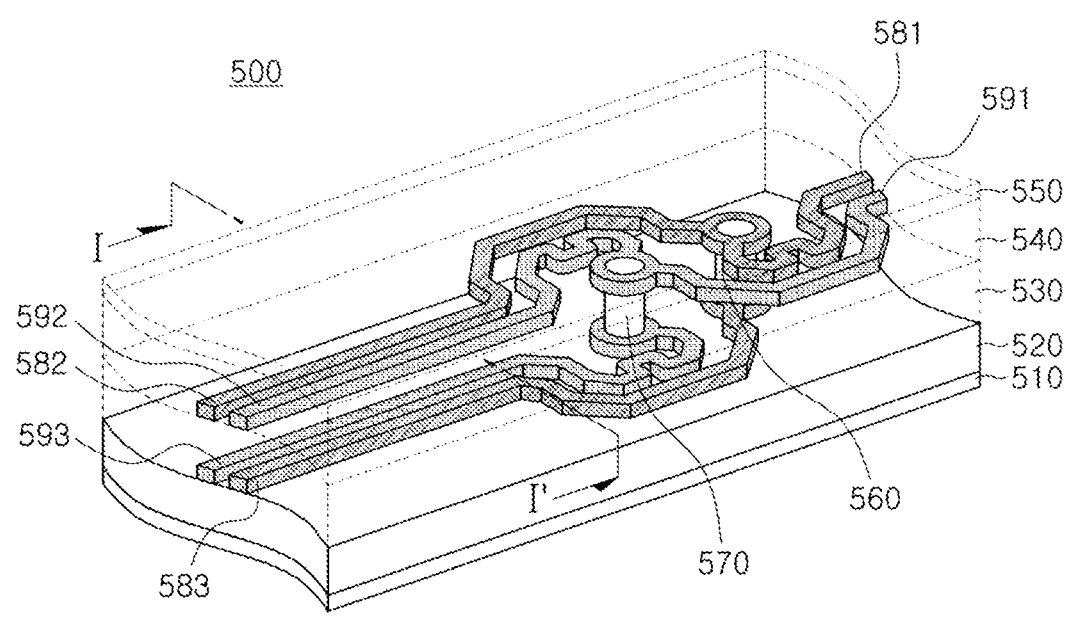
FIGS. 9 to 11 are views illustrating a differential signal transmission circuit according to a first example embodiment.
Figure 10:
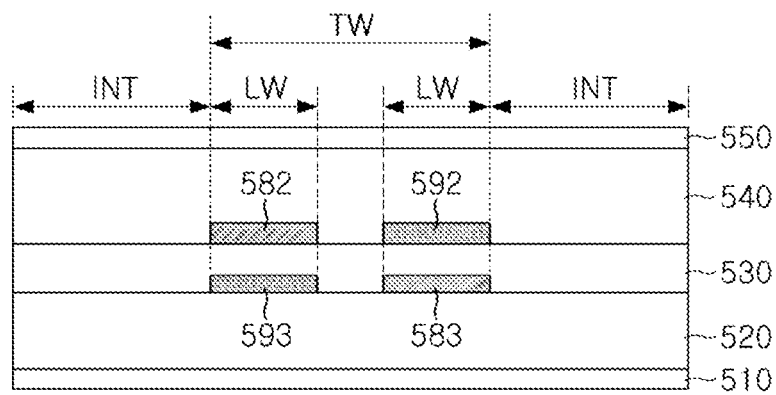
Figure 11:
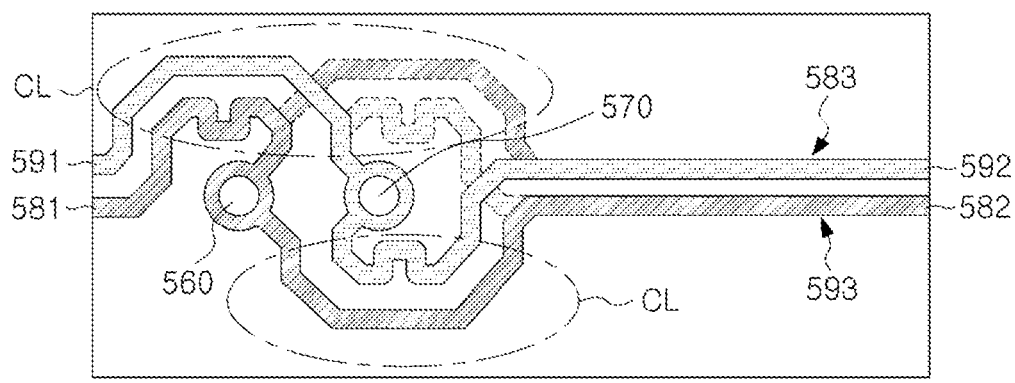

FIGS. 9 to 11 are views illustrating a differential signal transmission circuit according to a first example embodiment.

As will be described in detail below in connection with FIGS. 9 to 11, a first upper wiring pattern and a first lower wiring pattern according to the first example embodiment may be connected to a first common wiring pattern at both ends of a differential signal transmission circuit. In addition, a second upper wiring pattern and a second lower wiring pattern according to the first example embodiment may be connected to a second common wiring pattern at the both ends of the differential signal transmission circuit. The both ends of the differential signal transmission circuit may be connected to semiconductor devices mounted on a circuit board through the first and second common wiring patterns.

FIG. 9 is a perspective view illustrating one end of a differential signal transmission circuit wired on a circuit board, according to a first example embodiment. FIG. 10 is a cross-sectional view of the circuit board of FIG. 9, taken along line I-I'. FIG. 11 is a plan view of the circuit board of FIG. 9.

Referring to FIGS. 9 and 10, a circuit board 500 including a differential signal transmission circuit according to the first example embodiment may include a power plane 510, first to third insulating layers 520, 530, and 540, and a ground plane 550.

The power plane 510 may be connected to a power source, similar to the power plane 410 described with reference to FIG. 6. The first insulating layer 520 may be formed on an upper surface of the power plane 510. A first lower wiring pattern 583 and a second lower wiring pattern 593 may be formed to be side to side with each other on an upper surface of the first insulating layer 520. The second insulating layer 530 may be formed on the upper surface of the first insulating layer 520 to cover the first lower wiring pattern 583 and the second lower wiring pattern 593. A first upper wiring pattern 582 and a second upper wiring pattern 592 may be formed to be side to side with each other on an upper surface of the second insulating layer 530. The third insulating layer 540 may be formed on the upper surface of the second insulating layer 530 to cover the second upper wiring pattern 592 and the first upper wiring pattern 582. The ground plane 550 may be formed to cover the third insulating layer 540. The ground plane 550 may be electrically coupled to a ground signal or a reference signal, similar to the ground plane 450 described with reference to FIG. 6.

Referring to FIGS. 10 and 11, the second upper wiring pattern 592 may be formed to overlap the first lower wiring pattern 583 in the vertical direction, and the first upper wiring pattern 582 may be formed to overlap the second lower wiring pattern 593 in the vertical direction.

The first upper wiring patterns 582 and the second lower wiring pattern 593, and the first lower wiring patterns 583 and the second upper wiring pattern 592, may extend while having a constant line width, respectively. According to the first example embodiment, line widths LW of the first upper wiring patterns 582 and the second lower wiring pattern 593 may be the same as line widths LW of the first lower wiring patterns 583 and the second upper wiring pattern 592.

Referring to FIGS. 9 and 11, the differential signal transmission circuit may further include a first common wiring pattern 581 and a second common wiring pattern 591, formed on the upper surface of the second insulating layer 530. The first common wiring pattern 581 and the second common wiring pattern 591 may be connected to a semiconductor device mounted on the circuit board 500, for example, the memory device 310, the RCD controller 320, and the signal pin 330, described with reference to FIG. 3.

In addition, the circuit board 500 may further include a first via 560 and a second via 570, passing through the second insulating layer 530. The first upper wiring pattern 582 and the first lower wiring pattern 583 may be connected to the first common wiring pattern 581 through the first via 560, and the second upper wiring pattern 592 and the second lower wiring pattern 593 may be connected to the second common wiring pattern 591 through the second via 570.

In the differential signal transmission circuit, the first upper wiring pattern 582 and the first lower wiring pattern 583 may be provided to transmit an input signal, and the second lower wiring pattern 593 and the second upper wiring pattern 592 may be provided to transmit a complementary signal of the input signal. Specifically, the input signal may be transmitted from the semiconductor device mounted on the circuit board 500 to the first upper wiring pattern 582 and the first lower wiring pattern 583 through the first common wiring pattern 581. In addition, the complementary signal may be transmitted from the semiconductor device to the second lower wiring pattern 593 and the second upper wiring pattern 592 through the second common wiring pattern 591.

According to the first example embodiment, a line width LW used for an individual wiring pattern may be reduced, compared to the comparison line width CLW described with reference to FIG. 7, such that a differential signal transmission circuit has a predetermined level of characteristic impedance values. When the line width LW is reduced, signal interference with wiring patterns around the differential signal transmission circuit may be alleviated. Therefore, a wiring interval INT between the wiring patterns of the differential signal transmission circuit and surrounding wiring patterns may also be reduced.

Additional aspects of FIGS. 9 and 11 and the first example embodiment will be described below, after the description of FIGS. 12A to 12B.

Figure 12A:
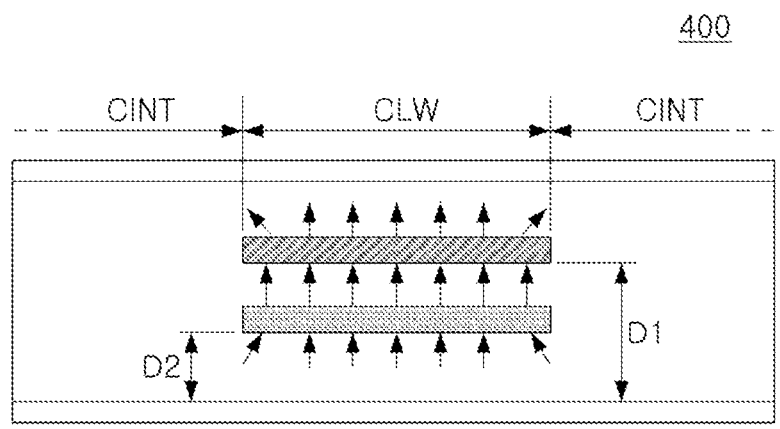
FIGS. 12A to 12B are views illustrating differential signal transmission circuits according to the comparative example and the first example embodiment.
Figure 12B:
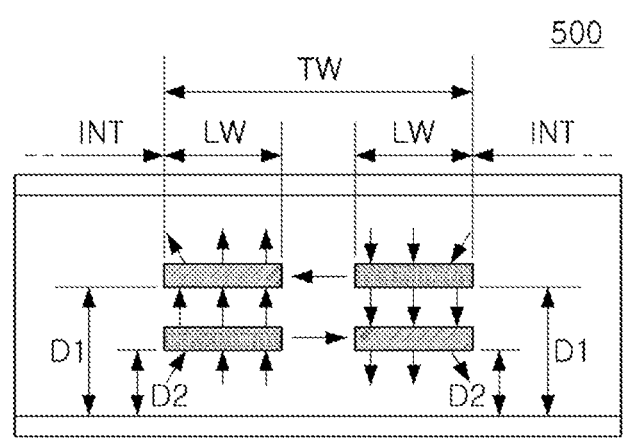

FIGS. 12A to 12B are views illustrating differential signal transmission circuits according to the comparative example and the first example embodiment.

The circuit board 400 illustrated in FIG. 12A may correspond to the circuit board 400 according to the comparative example described with reference to FIGS. 6 to 8, and the circuit board 500 illustrated in FIG. 12B may correspond to the circuit board 500 according to the first example embodiment described with reference to FIGS. 9 to 11.

Referring to FIG. 12A, an upper wiring pattern and a lower wiring pattern, having a comparison line width CLW, are illustrated. Solid arrows, illustrated around the upper wiring pattern and the lower wiring pattern, simply indicate strengths and directions of electric fields, formed therearound. Signals having opposite phases may be applied to the upper wiring pattern and the lower wiring pattern. Electric fields may overlap each other between the upper wiring pattern and the lower wiring pattern to form a strong electric field. For example, the upper wiring pattern and the lower wiring pattern may be strongly coupled to transmit a differential signal with minimized delay.

An electric field may be formed in upper and side portions of the upper wiring pattern by a signal applied to the upper wiring pattern, and an electric field may be formed in lower and side portions of the lower wiring pattern by a signal applied to the lower wiring pattern. According to the comparative example, the electric fields formed around the upper wiring pattern and the lower wiring pattern may interfere with signals transmitted through adjacent wiring patterns. In order to prevent the interference from the adjacent signals, adjacent wiring patterns on a circuit board 400 may be formed to be sufficiently spaced apart from the upper wiring pattern and the lower wiring pattern. For example, the adjacent wiring patterns may be formed in positions spaced apart from the upper wiring pattern and the lower wiring pattern by two or more times of the comparison line width CLW. The interval between wiring patterns of the differential signal transmission circuit and the adjacent wiring pattern may be referred to as the comparison wiring interval CINT.

Referring to FIG. 12B, upper wiring patterns and lower wiring patterns, having a line width LW, are illustrated. Solid arrows, illustrated around the wiring patterns, simply indicate strengths and directions of electric fields, formed around the wiring patterns. When signals having opposite phases are transmitted through upper and lower wiring patterns facing each other, electric fields of the upper wiring pattern and the lower wiring pattern may overlap. For example, the upper wiring pattern and the lower wiring pattern facing each other may be strongly coupled. Since signals having opposite phases may be applied to adjacent upper wiring patterns, the upper wiring patterns may be coupled to each other, and similarly, adjacent lower wiring patterns may be coupled to each other.

Since four wiring patterns may be coupled to each other, characteristic impedance values of a differential signal transmission circuit according to an embodiment may be similar to the characteristic impedance value of a differential signal transmission circuit according to the comparative example, even when the line width LW has a distance of half or less of the comparison line width CLW.

An electric field may be formed around wiring patterns of a differential signal transmission circuit by a signal applied to each of the wiring patterns, and the electric field may cause an interference with an adjacent signal transmitted through an adjacent wiring pattern. In order to prevent the interference from the adjacent signal, the adjacent wiring pattern may be formed to be sufficiently spaced apart from the wiring patterns of the differential signal transmission circuit. For example, adjacent wiring patterns may be formed in positions spaced apart from the wiring patterns of the differential signal transmission circuit by more than twice the line width LW. The interval between wiring patterns of the differential signal transmission circuit and the adjacent wiring pattern may be referred to as the wiring interval INT.

According to the first example embodiment, a total circuit width TW of a differential signal transmission circuit having a characteristic impedance value, similar to that of a differential signal transmission circuit of the comparative example, may be similar to a comparison line width CLW. Additionally, the wiring interval INT may be reduced by half or more compared to the comparison wiring interval CINT and, as such various wiring patterns may be efficiently integrated on a circuit board.

Referring again to FIG. 12A, a first separation distance D1 between the upper wiring pattern and the power plane 410 is different from a second separation distance D2 between the lower wiring pattern and the power plane 410. Power applied to the power plane 410 may include noise. Since the first separation distance D1 and the second separation distance D2 are different, the noise included in the power plane 410 may affect the upper wiring pattern and the lower wiring pattern in different degrees. For example, according to the comparative example, since common mode noise entering the upper wiring pattern and common mode noise entering the lower wiring pattern may be different, it may be difficult to remove the common mode noise using an input signal and a complementary signal, transmitted through the upper wiring pattern and the lower wiring pattern.

On the other hand, referring again to FIG. 12B, an input signal may be transmitted from the power plane 510 through the upper wiring pattern having a first separation distance D1 and the lower wiring pattern having a second separation distance D2. Similarly, a complementary signal may also be transmitted from the power plane 510 through the upper wiring pattern having the first separation distance D1 and the lower wiring pattern having the second separation distance D2. Thus, the input signal and the complementary signal may be affected by noise of the power plane 510 in a similar degree. Therefore, when an input signal and a complementary signal transmitted through wiring patterns of a differential signal transmission circuit according to the first example embodiment are used, a semiconductor device may obtain a signal from which common mode noise is removed.

In connection with FIGS. 9 to 11, the first example embodiment has been described taking a case in which the first common wiring pattern 581 and the second common wiring pattern 591 are formed on the upper surface of a second insulating layer 530 as an example, but, e.g., the first common wiring pattern 581 and the second common wiring pattern 591 may be formed on the upper surface of a first insulating layer 520, and/or may be formed on a layer different from the upper wiring patterns and the lower wiring patterns.

Referring again to FIG. 11, the wiring patterns 581, 582, and 583 for transmitting the input signal and the wiring patterns 591, 592, and 593 for transmitting the complementary signal may include a connection pattern CL, respectively. The connection pattern CL may electrically connect a via and a wiring pattern, e.g., an extending or straight portion of a wiring pattern, which are formed side by side, to transmit a differential signal. In the connection pattern CL, phases of an input signal and a complementary signal, transmitted through wiring patterns formed side by side, may be exactly opposite to each other. A shape of the connection pattern CL may vary from that illustrated in FIG. 11.

Figure 13:
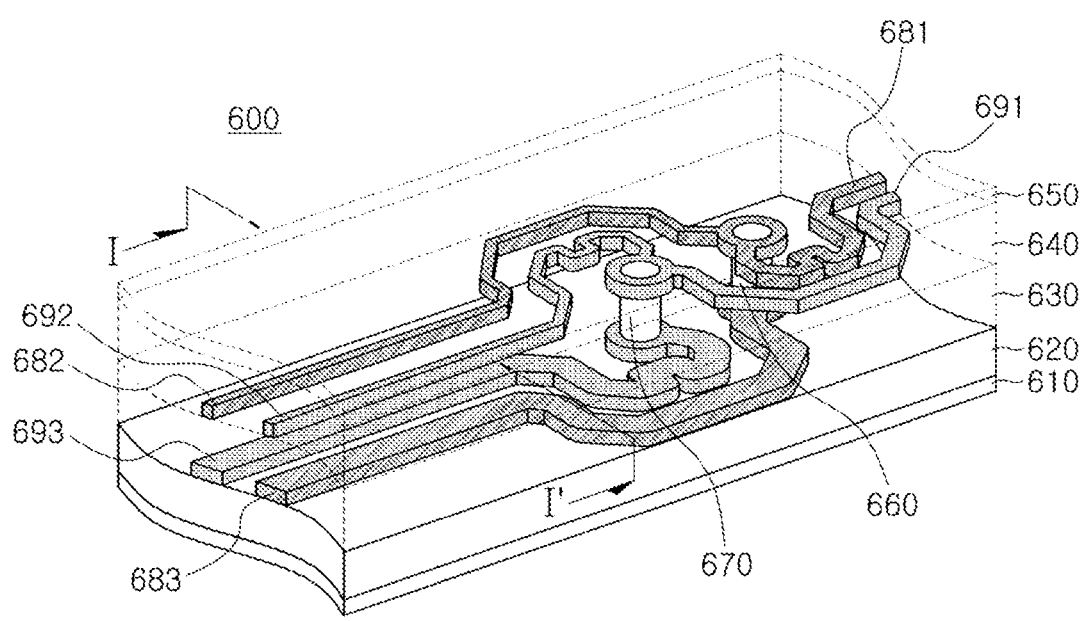
FIGS. 13 to 15 are views illustrating a differential signal transmission circuit according to a second example embodiment.
Figure 14:
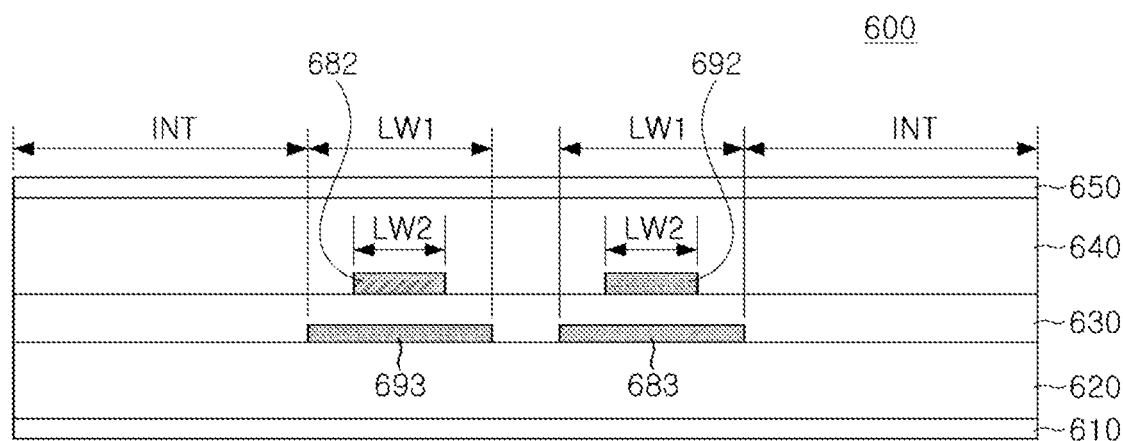
Figure 15:
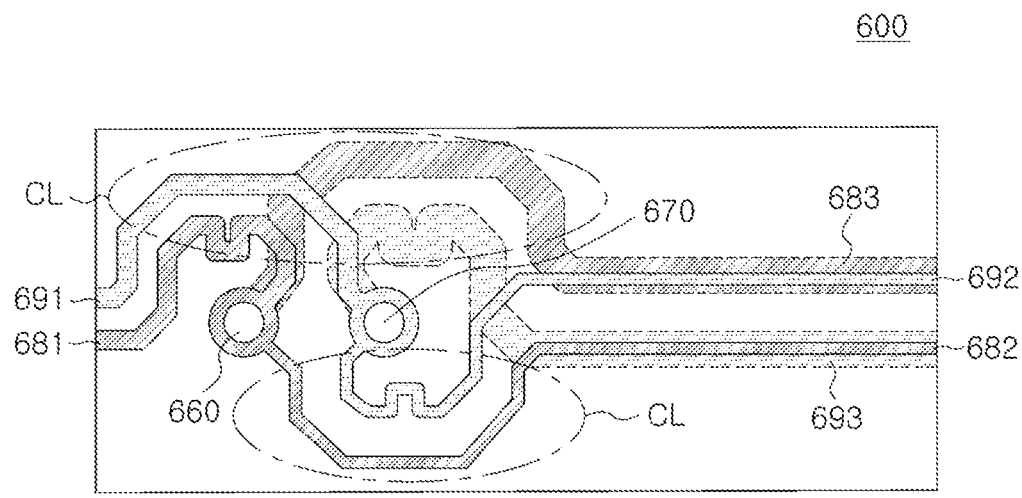

FIGS. 13 to 15 are views illustrating a differential signal transmission circuit according to a second example embodiment.

As will be described in detail below, and similarly to the differential signal transmission circuit according to the first example embodiment described with reference to FIGS. 9 to 11, a differential signal transmission circuit according to the second example embodiment may include a first upper wiring pattern and a first lower wiring pattern, connected to a first common wiring pattern at both ends. In addition, the differential signal transmission circuit according to the second example embodiment may include a second upper wiring pattern and a second lower wiring pattern, connected to a second common wiring pattern at the both ends. In the differential signal transmission circuit according to the second embodiment, line widths of the first and second upper wiring patterns may be different from line widths of the first and second lower wiring patterns.

FIG. 13 is a perspective view illustrating one end of a differential signal transmission circuit wired on a circuit board, according to a second example embodiment. FIG. 14 is a cross-sectional view of the circuit board of FIG. 13, taken along line I-I', and FIG. 15 is a plan view of the circuit board of FIG. 13.

Referring to FIGS. 13 and 14, a circuit board 600 including a differential signal transmission circuit according to the second example embodiment may include a power plane 610, first to third insulating layers 620, 630, and 640, and a ground plane 650.

The power plane 610, the first to third insulating layers 620, 630, and 640, and the ground plane 650 may be formed in a shape similar to the power plane 510, the first to third insulating layers 520, 530, and 540, and the ground plane 550, described with reference to FIGS. 9 and 10. In addition, a first lower wiring pattern 683 and a second lower wiring pattern 693 may be formed to be side to side with each other on an upper surface of the first insulating layer 620. A first upper wiring pattern 682 and a second upper wiring pattern 692 may be formed to be side to side with each other on an upper surface of the second insulating layer 630.

Referring to FIGS. 14 and 15, the wiring patterns 682, 683, 692, and 693 may extend while having a constant line width. According to the second example embodiment, a line width of the second upper wiring pattern 692 may be different from, e.g., narrower than, a line width of the first lower wiring pattern 683, and a line width of the first upper wiring pattern 682 may be different from, e.g., narrower than, a line width of the second lower wiring pattern 693.

In FIG. 14, the line widths of the first and second upper wiring patterns 682 and 692 may be referred to as second line widths LW2, and the line widths of the first and second lower wiring patterns 683 and 693 may be referred to as first line widths LW1.

In other example embodiments, the first line width LW1 may be narrower than the second line width LW2.

The second upper wiring pattern 692 may be formed to overlap the first lower wiring pattern 683 in the vertical direction, and the first upper wiring pattern 682 may be formed to overlap the second lower wiring pattern 693 in the vertical direction. Referring to FIG. 14, a middle of the second upper wiring pattern 692 and a middle of the first lower wiring pattern 683 may be vertically aligned or perpendicularly aligned with each other, and a middle of the first upper wiring pattern 682 and a middle of the second lower wiring pattern 693 may be vertically aligned or perpendicularly aligned with each other.

Referring to FIGS. 13 and 15, the differential signal transmission circuit may further include a first common wiring pattern 681 and a second common wiring pattern 691, connected to a semiconductor device mounted on the circuit board 600. The first upper wiring pattern 682 and the first lower wiring pattern 683 may be connected to the first common wiring pattern 681 through a first via 660 passing through the second insulating layer 630 to transmit an input signal. In addition, the second lower wiring pattern 693 and the second upper wiring pattern 692 may be connected to the second common wiring pattern 691 through a second via 670 passing through the second insulating layer 630 to transmit a complementary signal.

According to the second example embodiment, even if the upper wiring pattern and the lower wiring pattern are not accurately aligned, e.g., are misaligned, in the vertical direction, e.g., due to limitations in a process of stacking circuit boards or traces, variations of characteristic impedance values of the differential signal transmission circuit may be reduced. This will now be described in detail.

Figure 16A:
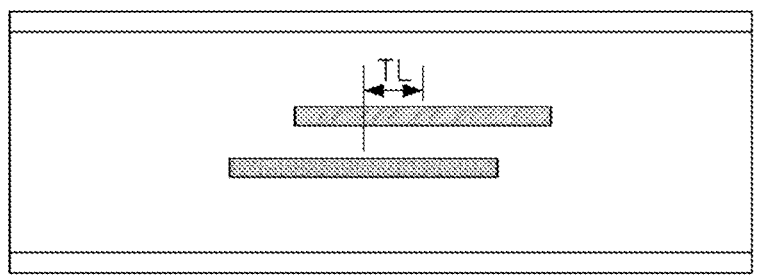
FIGS. 16A to 17 are views illustrating differential signal transmission circuits according to the comparative example and the second example embodiment.
Figure 16B:
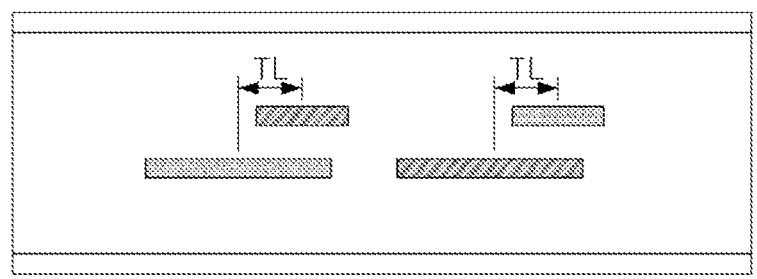
Figure 17:
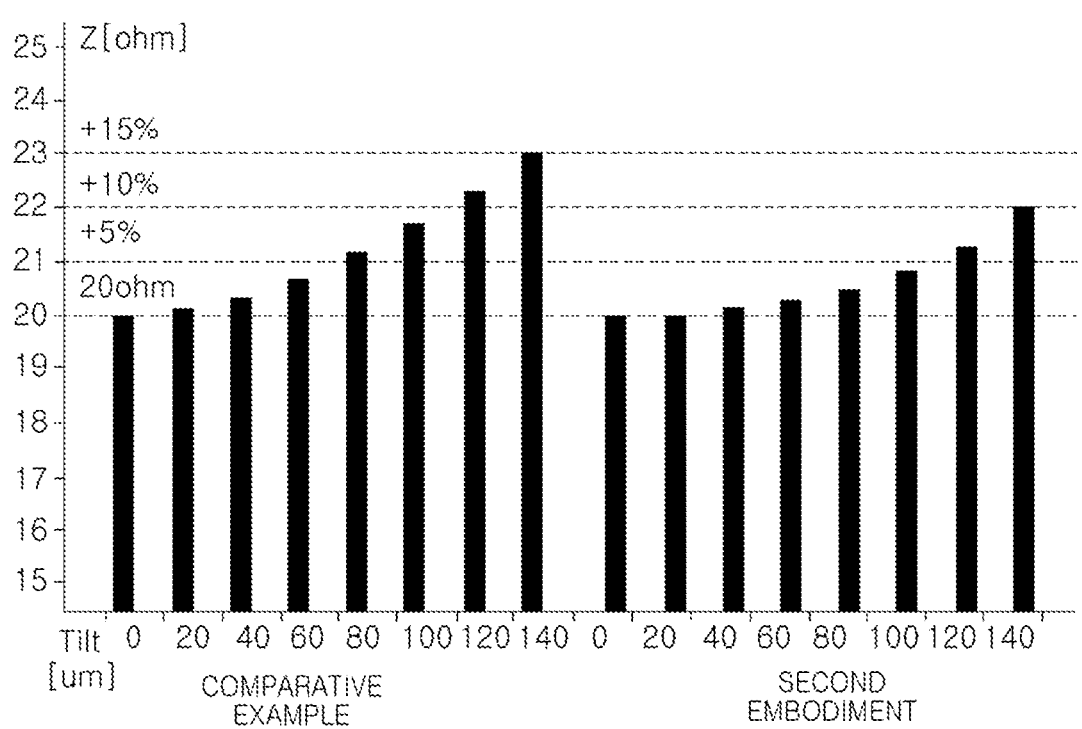

FIGS. 16A to 17 are views illustrating differential signal transmission circuits according to the comparative example and the second example embodiment.

The circuit board 400 illustrated in FIG. 16A may correspond to the circuit board 400 according to the comparative example described with reference to FIG. 7, and the circuit board 600 illustrated in FIG. 16B may correspond to the circuit board 600 according to the second example embodiment described with reference to FIG. 14.

Referring to FIG. 16A, the upper wiring pattern 482 and the lower wiring pattern 492, having the comparison line width CLW, are illustrated. The upper wiring pattern 482 and the lower wiring pattern 492 may not be accurately aligned and may be misaligned in the vertical direction. A misalignment width TL indicates a degree to which the upper wiring pattern 482 and the lower wiring pattern 492 are misaligned with respect to a middle of the upper wiring pattern 482 and a middle of the lower wiring pattern 492.

Referring to FIG. 16B, the first and second upper wiring patterns 682 and 692 having the second line width LW2 and the first and second lower wiring patterns 683 and 693 having the first line width LW1 are illustrated. A differential signal transmission circuit including wiring patterns of FIG. 16B may have the same characteristic impedance values as a differential signal transmission circuit corresponding to the comparative example of FIG. 16A. The first and second upper wiring patterns 682 and 692 and the first and second lower wiring patterns 683 and 693 may not be accurately aligned and may be misaligned in the vertical direction. FIG. 16B illustrates a case in which the first and second upper wiring patterns 682 and 692 and the first and second lower wiring patterns 683 and 693 are misaligned to have the same misalignment width TL as in FIG. 16A, based on a middle thereof.

According to the comparative example of FIG. 16A, when wiring patterns are misaligned to have the misalignment width TL, widths of wiring patterns facing each other may be reduced by the misalignment width TL. As widths of the wiring patterns facing each other decrease, coupling strength of the wiring patterns may decrease, and characteristic impedance values of the differential signal transmission circuit may increase.

On the other hand, according to the second embodiment of FIG. 16B, even when the wiring patterns are misaligned by the misalignment width TL, the widths of the wiring patterns facing each other may not be changed significantly. According to the second example embodiment, line widths of the first and second upper wiring patterns 682 and 692 and line widths of the first and second lower wiring patterns 683 and 693 may be different from each other to reduce an increase in characteristic impedance values, even when the upper and lower wiring patterns are misaligned. Therefore, signal transmission performance of a differential signal transmission circuit may be guaranteed.

FIG. 17 illustrates a change in characteristic impedance value according to a degree of misalignment of wiring patterns, in the comparative example and the second example embodiment. Specifically, a horizontal axis of a graph of FIG. 17 indicates a degree of misalignment of wiring patterns, and a vertical axis of the graph indicates characteristic impedance values, in the comparative example and the second embodiment.

In the example of FIG. 17, when wiring patterns are not misaligned with each other, characteristic impedance values in the comparative example and the second embodiment are the same at 20 ohms. As described with reference to FIGS. 16A and 16B, according to the second example embodiment, a change in characteristic impedance value according to a degree of misalignment may be reduced, compared to the comparative example. For example, when the upper wiring pattern and the lower wiring pattern are misaligned by 140 μm, a characteristic impedance value increases by about 15% according to the comparative example, whereas a characteristic impedance value increases only by about 10% according to the second embodiment. According to the second example embodiment, even when the upper wiring patterns and the lower wiring patterns of the differential signal transmission circuit are not accurately aligned in a center, e.g., due to limitations in process of stacking the circuit board, errors in characteristic impedance value may be reduced.

According to the first and second embodiments described with reference to FIGS. 9 to 17, two upper wiring patterns and two lower wiring patterns may be used to transmit a differential signal. However, this may be varied, e.g., a differential signal transmission circuit according to a third example embodiment may include three or more upper wiring patterns and three or more lower wiring patterns, and the upper wiring patterns and the lower wiring patterns may be provided to transmit an input signal or a complementary signal, respectively. This will now be described in detail.

Figure 18:
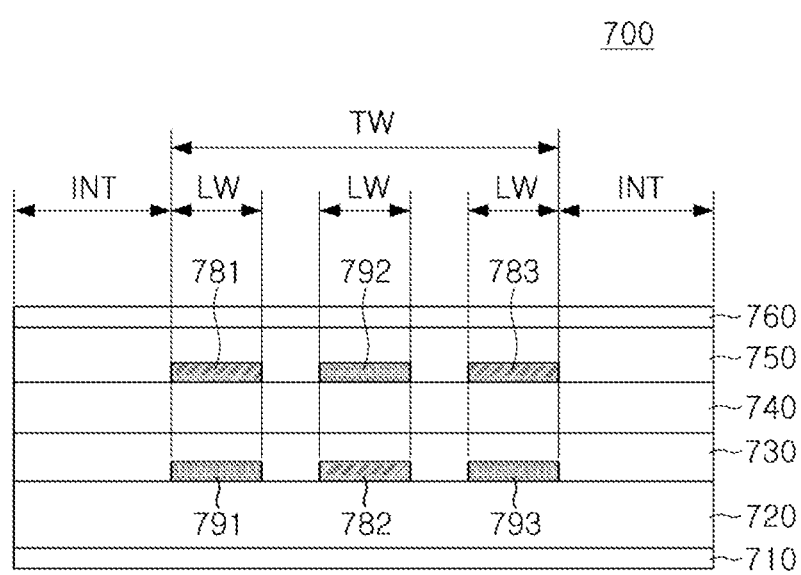
FIG. 18 illustrates a cross-sectional view of a differential signal transmission circuit according to a third example embodiment.

FIG. 18 illustrates a cross-sectional view of a differential signal transmission circuit according to a third example embodiment.

Referring to FIG. 18, a circuit board 700 including a differential signal transmission circuit according to a third example embodiment may include a power plane 710, first to fourth insulating layers 720, 730, 740, and 750, and a ground plane 760.

The power plane 710 may be connected to a power source, similar to the power plane 410 described with reference to FIG. 6. The first insulating layer 720 may be formed on an upper surface of the power plane 710.

A first lower wiring pattern 791, a second lower wiring pattern 782, and a third lower wiring pattern 793 may be formed to be side to side with each other on an upper surface of the first insulating layer 720. The second insulating layer 730 may be formed on the upper surface of the first insulating layer 720 to cover the first lower wiring pattern 791, the second lower wiring pattern 782, and the third lower wiring pattern 793.

The third insulating layer 740 may be formed on an upper surface of the second insulating layer 730, and a first upper wiring pattern 781, a second upper wiring pattern 792, and a third upper wiring pattern 783 may be formed to be side to side with each other on an upper surface of the third insulating layer 740.

The first upper wiring pattern 781 may be formed to overlap the first lower wiring pattern 791 in the vertical direction. The second upper wiring pattern 792 may be formed to overlap the second lower wiring pattern 782 in the vertical direction. The third upper wiring pattern 783 may be formed to overlap the third lower wiring pattern 793 in the vertical direction.

The fourth insulating layer 750 may be formed on the upper surface of the third insulating layer 740 to cover the first upper wiring pattern 781, the second upper wiring pattern 792, and the third upper wiring pattern 783. The ground plane 760 may be electrically coupled to a ground signal or a reference signal.

The upper wiring patterns and the lower wiring patterns may be provided to alternately transmit an input signal and a complementary signal. For example, the first upper wiring pattern 781, the second lower wiring pattern 782, and the third upper wiring pattern 783 may be provided to transmit the same input signal, and the first lower wiring pattern 791, the second upper wiring pattern 792, and the third lower wiring pattern 793 may be provided to transmit the same complementary signal.

The circuit board 700 may include common wiring patterns for connecting a semiconductor device mounted on the circuit board 700 and the wiring patterns 781 to 793. For example, first and second common wiring patterns (not illustrated) may be formed on the upper surface of the second insulating layer 730 at both ends of the differential signal transmission circuit. In addition, the circuit board 700 may further include first and second vias (not illustrated) passing through the second and third insulating layers 730 and 740.

The first upper wiring pattern 781, the second lower wiring pattern 782, and the third upper wiring pattern 783 may be connected to the first common wiring pattern through the first via, to receive an input signal from the semiconductor device or to provide the input signal to the semiconductor device. The first lower wiring pattern 791, the second upper wiring pattern 792, and the third lower wiring pattern 793 may be connected to the second common wiring pattern through the second via, to receive a complementary signal from a semiconductor device, or to provide the complementary signal to the semiconductor device.

According to the third example embodiment, in the differential signal transmission circuit, three or more wiring patterns for transmitting an input signal and three or more wiring patterns for transmitting a complementary signal may be alternately arranged above and below an insulating layer, which may allow for reducing a line width LW of an individual wiring pattern while inducing strong coupling of entire wiring patterns. Since the line width LW of the individual wiring pattern may be reduced, adjacent wiring patterns may be disposed adjacent to each other, without being affected by the differential signal. Therefore, various wiring patterns may be efficiently disposed on a circuit board.

FIG. 18 illustrates a case in which line widths LW of the wiring patterns 781 to 793 are the same, but line widths of the upper wiring patterns 781, 792, and 783 may be different from line widths of the lower wiring patterns 791, 782, and 793. For example, the line widths of the upper wiring patterns 781, 792, and 783 may be formed to be narrower than the line widths of the lower wiring patterns 791, 782, and 793.

According to the example embodiments described with reference to FIGS. 1 to 18, a differential signal transmission circuit for connecting devices such as a memory device 310 and an RCD controller 320, mounted on a circuit board, may be mounted on the circuit board. The differential signal transmission circuit may include a plurality of input wiring patterns and a plurality of complementary wiring patterns, alternately arranged on an upper surface and a lower surface of an insulating layer. The plurality of input wiring patterns may be connected to a common input wiring pattern at both ends of the differential signal transmission circuit, to be connected to the devices mounted on the circuit board. In addition, the plurality of complementary wiring patterns may be connected to a common complementary wiring pattern at the both ends of the differential signal transmission circuit, to be connected to the devices.

When the input wiring patterns and the complementary wiring patterns of the differential signal transmission circuit are alternately arranged on the upper and lower surfaces of the insulating layer, to strongly couple the wiring patterns each other, and to reduce characteristic impedance values of the differential signal transmission circuit.

Hereinafter, systems to which a differential signal transmission circuit according to an example embodiment is applied will be described with reference to FIGS. 19 to 22.

Figure 19:
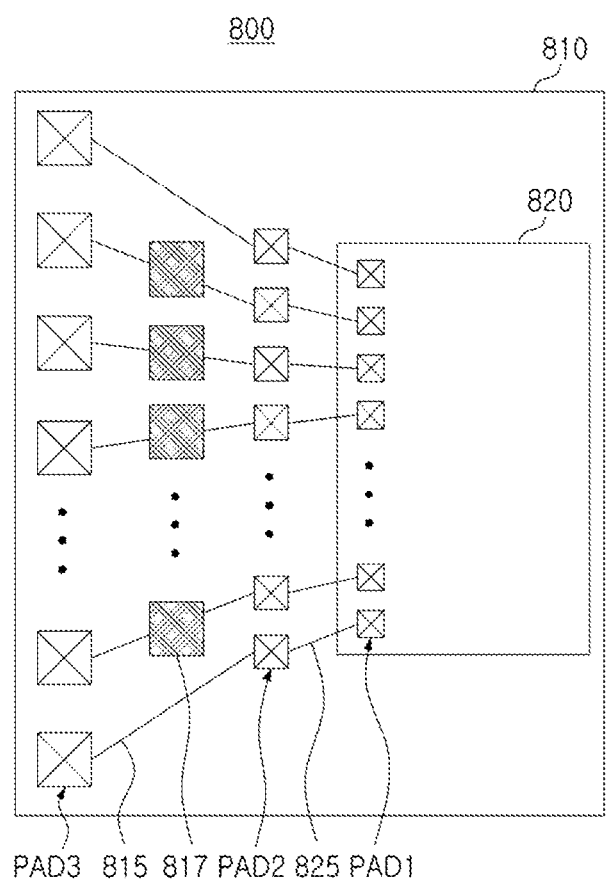
FIG. 19 is a view schematically illustrating a semiconductor module including a semiconductor device according to an example embodiment.

FIG. 19 is a view schematically illustrating a semiconductor module including a semiconductor device according to an example embodiment.

Referring to FIG. 19, a semiconductor module 800 according to an example embodiment may include a module substrate 810 and a semiconductor device 820, and the semiconductor device 820 may be mounted on the module substrate 810.

The semiconductor device 820 may include a plurality of first pads PAD1, and the first pads PAD1 may be connected to a plurality of second pads PAD2 through wires 825 formed on the module substrate 810. For example, the first pads PAD1 may be edge pads provided by redistribution layers included in the semiconductor device 820.

The second pads PAD2 may be connected to third pads PAD3 through substrate wirings 815 formed on the module substrate 810. The third pads PAD3 may be pads for connecting the semiconductor module 800 to another external semiconductor device, a semiconductor module, a substrate, or the like.

The module substrate 810 may transmit a differential signal through at least some of the substrate wirings 815 connecting the second pads PAD2 and the third pads PAD3. According to an example embodiment, the substrate wirings 815 may include wiring patterns 817, branched in plural and disposed on upper and lower surfaces of an insulating layer, to transmit the differential signal. The wiring patterns 817 may be formed as, e.g., wiring patterns described herein with respect to the first, second, and third example embodiments. Wiring patterns transmitting an input signal and wiring patterns transmitting a complementary signal may be alternately arranged on the upper and lower surfaces of the insulating layer, to induce strong coupling between the wiring patterns.

Figure 20:
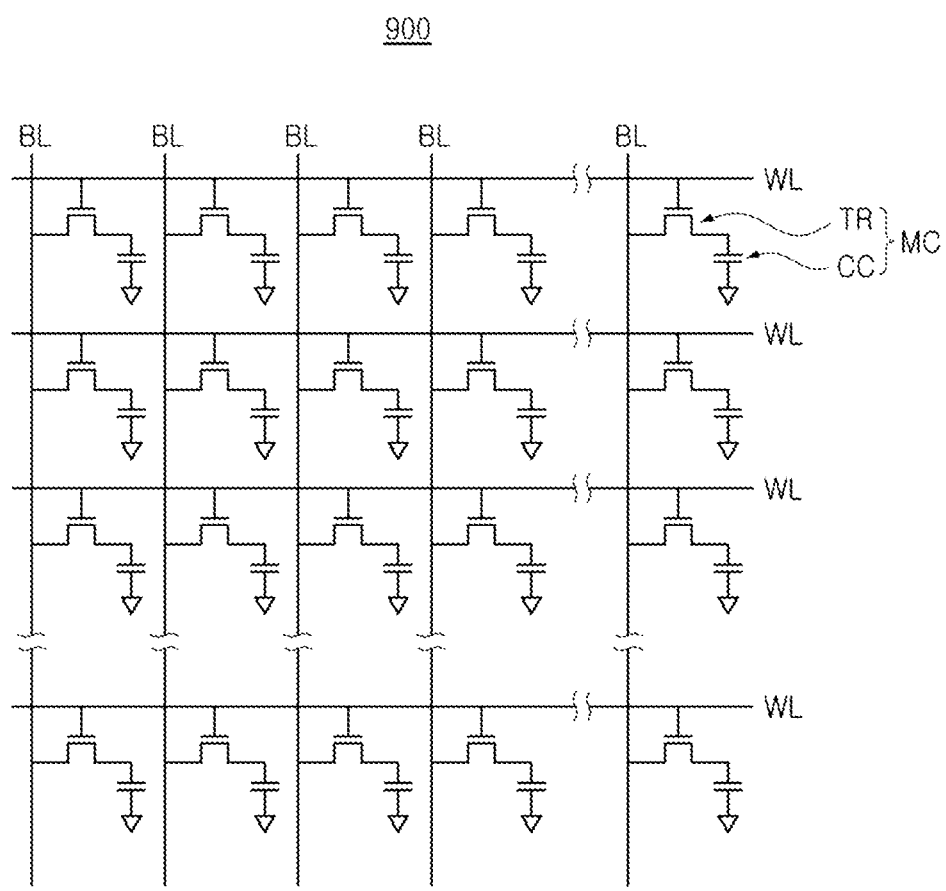
FIGS. 20 and 21 are views illustrating a semiconductor device according to an example embodiment.
Figure 21:
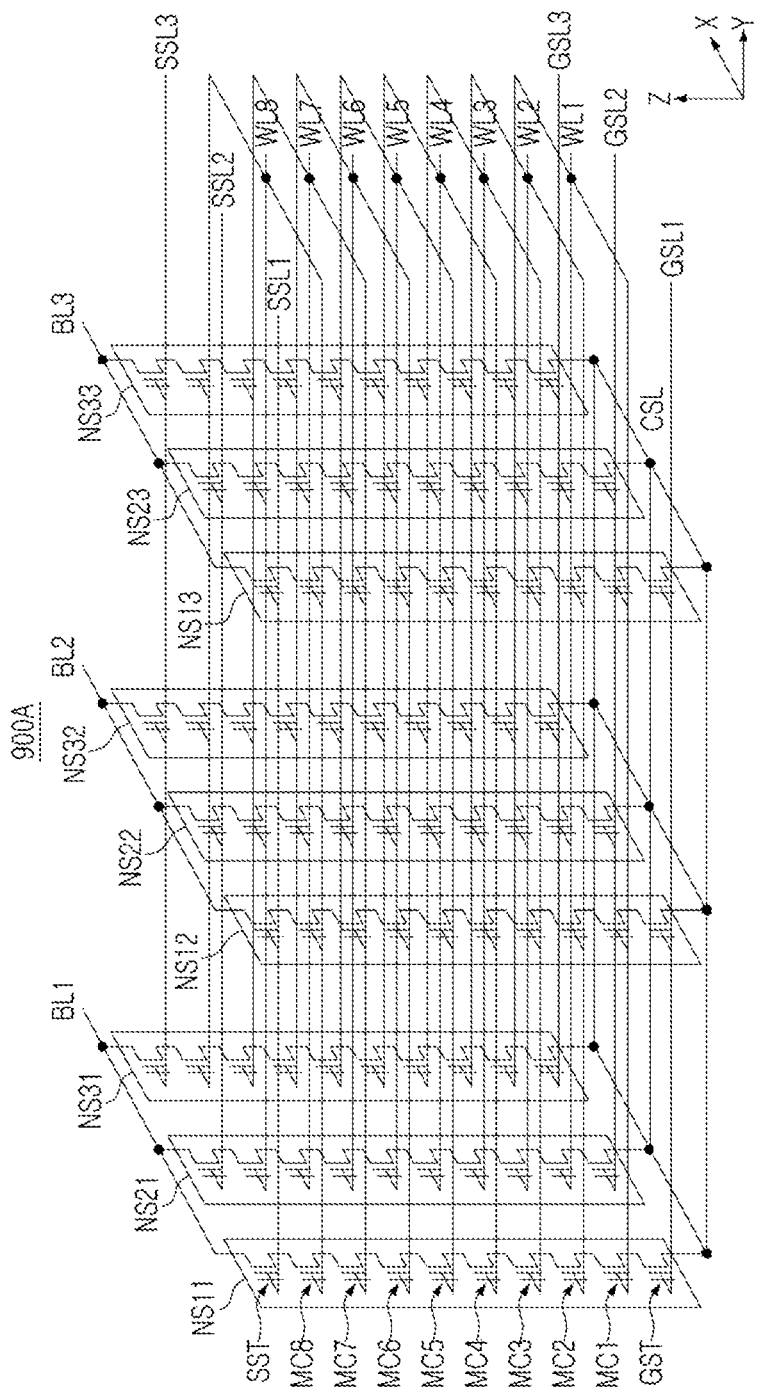

FIGS. 20 and 21 are views illustrating a semiconductor device according to an example embodiment.

In an embodiment illustrated in FIG. 20, a semiconductor device 900 may be a volatile memory device. The semiconductor device 900 may include a plurality of memory cells MC connected to bit lines BL and word lines WL, and each of the plurality of memory cells MC may include a cell switch TR and a cell capacitor CC. For example, the cell switch TR may be turned on and the cell capacitor CC may be charged or discharged, to store data in each of the plurality of memory cells MC, and the cell switch TR may be turned on and a voltage of the cell capacitor CC may be measured, to read the data stored in each of the plurality of memory cells MC.

In an example embodiment illustrated in FIG. 21, a semiconductor device 900A may be a non-volatile memory device. In the semiconductor device 900A illustrated in FIG. 21, memory cells MC1 to MC8 may be formed on a substrate to have a three-dimensional structure. For example, the plurality of memory cell strings NS11 to NS33 included in the semiconductor device 900A may be formed in a direction, perpendicular to the substrate.

Referring to FIG. 21, the semiconductor device 900A may include a plurality of memory cell strings NS11 to NS33 connected between bit lines BL1 to BL3 and a common source line CSL. Each of the plurality of memory cell strings NS11 to NS33 may include a string select transistor SST, a plurality of memory cells MC1 to MC8, and a ground select transistor GST. In FIG. 21, each of the plurality of memory cell strings NS11 to NS33 is illustrated as including eight memory cells MC1 to MC8, but this is merely an example.

The string select transistor SST may be connected to string select lines SSL1 to SSL3, corresponding thereto. The plurality of memory cells MC1 to MC8 may be respectively connected to word lines WL1 to WL8, corresponding thereto. In some example embodiments, at least one of the word lines WL1 to WL8 may be provided as a dummy word line. The ground select transistor GST may be connected to ground select lines GSL1 to GSL3, corresponding thereto. The string select transistor SST may be connected to bit lines BL1 to BL3, corresponding thereto, and the ground select transistor GST may be connected to the common source line CSL.

Each of the word lines WL1 to WL8 may be commonly connected to a plurality of memory cells MC1 to MC8, disposed on the same height, and the ground select lines GSL1 to GSL3 and the string select lines SSL1 to SSL3 may be respectively separated. Although eight word lines WL1 to WL8 and three bit lines BL1 to BL3 are illustrated in FIG. 21, this is merely an example.

The semiconductor devices 900 and 900A according to the example embodiments illustrated in FIGS. 20 and 21 may receive and store data, and may output the stored data at high speed. Therefore, the semiconductor devices 900 and 900A may operate in synchronization with a clock signal or a data strobe signal, having a very high frequency. The clock signal or the data strobe signal may be transmitted through a differential signal transmission circuit. In order to transmit a differential signal having a high frequency without delay thereof, a differential signal transmission circuit according to example embodiments and having an improved characteristic impedance value may be employed.

According to an example embodiment, a differential signal transmission circuit may include a plurality of input wiring patterns and a plurality of complementary wiring patterns, alternately arranged on an upper surface and a lower surface of an insulating layer. The wiring patterns may be strongly coupled to each other, and characteristic impedance values of the differential signal transmission circuit may be improved. Therefore, a degree of integrity of a clock signal or a data strobe signal, having a high frequency, may be secured in the semiconductor devices 900 and 900A mounted on a circuit board including a differential signal transmission circuit.

Figure 22:
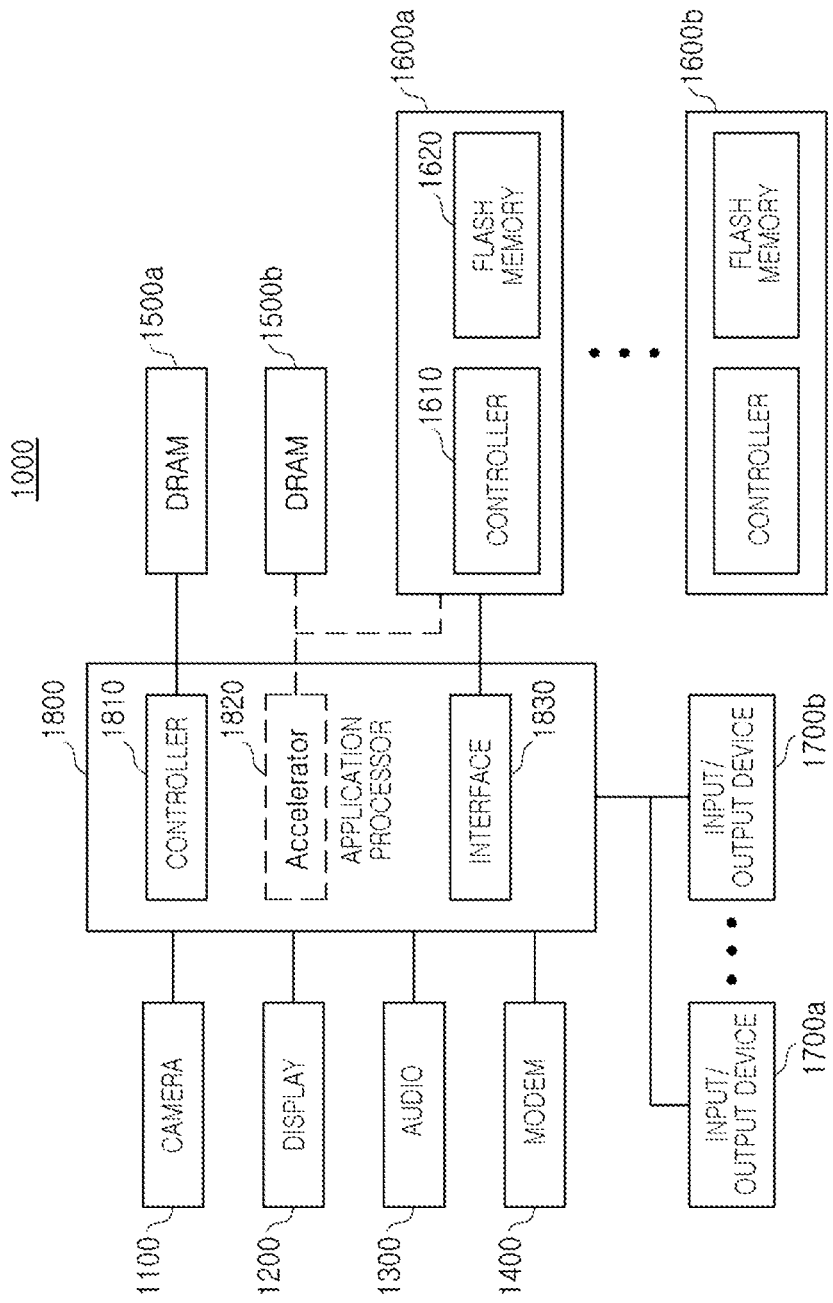
FIG. 22 is a view schematically illustrating a system including a semiconductor device according to an example embodiment.

FIG. 22 is a view schematically illustrating a system including a semiconductor device according to an example embodiment.

Referring to FIG. 22, a mobile device 1000 may include a camera 1100, a display 1200, an audio processor 1300, a modem 1400, DRAMs 1500*a* and 1500*b*, flash memory devices 1600*a* and 1600*b*, input/output devices 1700*a* and 1700*b*, a sensor device 1800, and an application processor (hereinafter, "AP") 1900.

The mobile device 1000 may be implemented as a laptop computer, a portable terminal, a smart phone, a tablet PC, a wearable device, a healthcare device, or an internet-of-things (IoT) device. Also, the mobile device 1000 may be implemented as a server or a personal computer.

Various components included in the mobile device 1000 may operate in synchronization with a predetermined clock. For example, the display 1200 may display an image according to a predetermined scan rate, and the DRAMs 1500*a* and 1500*b* and the flash memory devices 1600*a* and 1600*b* may also store and read data at a predetermined speed, or may operate according to a predetermined clock to communicate with other external devices. The input/output devices 1700*a* and 1700*b* and the AP 1900 may also operate according to a predetermined clock.

The camera 1100 may capture a still image or a moving image according to a user's control. The mobile device 1000 may acquire specific information using the still image/moving image captured by the camera 1100, or may convert the still image/moving image into other types of data such as text or the like, and may store the same. The camera 1100 may include a plurality of cameras having different angles of view, aperture values, or the like. In addition, the camera 1100 may further include a camera using depth information of a subject and/or a background to generate a depth image, in addition to a camera capturing an image of the subject to generate an actual image.

The display 1200 may also be used as an input device of the mobile device 1000 by providing a touchscreen function. In addition, the display 1200 may be provided integrally with a fingerprint sensor or the like, to provide a security function of the mobile device 1000. The audio processor 1300 may process audio data stored in the flash memory devices 1600*a* and 1600*b* or audio data included in content received externally through the modem 1400, the input/output devices 1700*a* and 1700*b*, or the like.

The modem 1400 may modulate and transmit a signal to transmit/receive wired/wireless data, and may demodulate a signal received externally to restore an original signal. The input/output devices 1700*a* and 1700*b* may be devices providing digital input/output, and may include a port connectable to an external recording medium, an input device such as a touchscreen, a mechanical button key, or the like, output devices capable of outputting vibration in a haptic manner or the like, or the like.

The sensor device 1800 may include a plurality of sensors collecting various types of information from the outside. In an example embodiment, the sensor device 1800 may include receives biometric information from an illuminance sensor for detecting brightness of light, a gyro sensor for detecting movement of the mobile device 1000, a biosensor for obtaining biological information from a user's body contacting and/or close to the mobile device 1000, or the like.

The AP 1900 may control an overall operation of the mobile device 1000. For example, the AP 1900 may control the display 1200 to display a portion of contents stored in the flash memory devices 1600a and 1600b on a screen. Also, when a user input is received through the input/output devices 1700a and 1700b, the AP 1900 may perform a control operation corresponding to the user input.

In an example embodiment, the AP 1900 may include an accelerator block 1920 that may be a dedicated circuit for AI data operation. Alternatively, according to example embodiments, a separate accelerator chip may be provided separately from the AP 1900, and the DRAM 1500b may be additionally connected to the accelerator block 1920 or the accelerator chip. The accelerator block 1920 may be a function block designed for performing a specific function of the AP 1900, and may include a graphics processor (GPU), which is a block for specifically performing graphic data processing, a neural processing unit (NPU), which is a block for specifically performing AI calculation and inference, a data processing unit (DPU), which is a block for specializing in data processing, or the like.

A differential signal transmission circuit according to an example embodiment may be variously employed in components connected to each other in the mobile device 1000 to communicate with each other. For example, a differential signal transmission circuit according to an example embodiment may be applied to a circuit board on which the camera 1100, the display 1200, the audio processor 1300, the modem 1400, the DRAMs 1500a and 1500b, the flash memory devices 1600a and 1600b, the input/output devices 1700a and 1700b, the sensor device 1800, and the AP 1900 are mounted, to quickly transmit a differential signal having a high frequency.

By way of summation and review, a multilayer circuit board may be manufactured such that a plurality of wiring patterns stacked in multiple layers are arranged with an insulating layer interposed therebetween, and wiring patterns disposed on different layers may be electrically connected by a via structure. In order to increase signal integrity of a semiconductor device, a differential signal transmission circuit may be used in a multilayer circuit board. The differential signal transmission circuit may simultaneously transmit an input signal to be transmitted and a complementary signal thereof, using a pair of wiring patterns adjacent to each other. The input signal and the complementary signal may be used to cancel natural noise generated from a surrounding environment. Accordingly, signal integrity may be improved.

Various methods for improving coupling between wiring patterns of a differential signal transmission circuit have been considered to transmit a differential signal having a high frequency without loss thereof, in response to a trend toward higher performance of semiconductor devices.

As described above, embodiments may provide a circuit board including a differential signal transmission circuit improving coupling of wiring patterns and reducing interference with adjacent wiring patterns, and a semiconductor module including the circuit board.

According to an example embodiment, a differential signal transmission circuit may include a plurality of input wiring patterns transmitting an input signal and a plurality of complementary wiring patterns transmitting a complementary signal of the input signal, and the plurality of input wiring patterns and the complementary wiring patterns may be alternately arranged on an upper surface and a lower surface of an insulating layer.

According to an example embodiment, a line width used to implement coupling having the same strength in respective wiring patterns may be reduced, and interference with adjacent signal lines may be alleviated.

In addition, input signal lines and complementary signal lines may be formed on the same layer, such that normal or common mode noise may be effectively canceled out, and signal integrity may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A circuit board, comprising:
a first insulating layer;
a first wiring pattern and a second wiring pattern each formed to be side to side with each other on an upper surface of the first insulating layer;
a second insulating layer formed on the upper surface of the first insulating layer to cover the first and second wiring patterns;
a third wiring pattern formed on an upper surface of the second insulating layer to overlap the first wiring pattern in a vertical direction;
a fourth wiring pattern formed on the upper surface of the second insulating layer to overlap the second wiring pattern in the vertical direction;
a first via passing through the second insulating layer and connecting the first and fourth wiring patterns; and
a second via passing through the second insulating layer and connecting the second and third wiring patterns,
wherein a line width of the first wiring pattern is different from a line width of the third wiring pattern, and
wherein a line width of the second wiring pattern is different from a line width of the fourth wiring pattern.

2. The circuit board as claimed in claim 1, wherein:
a middle of the first wiring pattern and a middle of the third wiring pattern are vertically aligned with each other, and
a middle of the second wiring pattern and a middle of the fourth wiring pattern are vertically aligned with each other.

3. The circuit board as claimed in claim 1, wherein:
the line width of the first wiring pattern is wider than the line width of the third wiring pattern, and
the line width of the second wiring pattern is wider than the line width of the fourth wiring pattern.

4. The circuit board as claimed in claim 1, further comprising:
a power plane disposed on a lower surface of the first insulating layer;
a third insulating layer formed on the upper surface of the second insulating layer to cover the third and fourth wiring patterns; and a ground plane formed on an upper surface of the third insulating layer.

5. The circuit board as claimed in claim 1, wherein:
the first and fourth wiring patterns are provided to transmit the same input signal, and
the second and third wiring patterns are provided to transmit a complementary signal of the input signal.

6. The circuit board as claimed in claim 5, further comprising:
a fifth wiring pattern connecting a semiconductor device mounted on the circuit board and the first via; and
a sixth wiring pattern connecting the semiconductor device and the second via.

7. A circuit board, comprising:
an insulating layer;
a first via and a second via each passing through the insulating layer;
at least one first upper wiring pattern and at least one first lower wiring pattern, connected to the first via; and
at least one second upper wiring pattern and at least one second lower wiring pattern, connected to the second via, wherein:
the at least one first upper wiring pattern and at least one second upper wiring pattern are alternately disposed on an upper surface of the insulating layer,
the at least one first lower wiring pattern is disposed on a lower surface of the insulating layer to overlap the at least one second upper wiring pattern in a vertical direction, and
the at least one second lower wiring pattern is disposed on the lower surface of the insulating layer to overlap the at least one first upper wiring pattern in the vertical direction,
wherein a line width of the at least one first upper wiring pattern is different from a line width of the at least one second lower wiring pattern, and
wherein a line width of the at least one second upper wiring pattern is different from a line width of the at least one first lower wiring pattern.

8. The circuit board as claimed in claim 7, wherein the line width of each of the at least one first upper wiring pattern and the at least one second upper wiring pattern is narrower than the line width of each of the at least one first lower wiring pattern and the at least one second lower wiring pattern.

9. The circuit board as claimed in claim 7, wherein:
the at least one first upper wiring pattern and the at least one first lower wiring pattern are provided to transmit the same input signal, and
the at least one second upper wiring pattern and the at least one second lower wiring pattern are provided to transmit a complementary signal of the input signal.

10. The circuit board as claimed in claim 9, further comprising:
a first common wiring pattern connecting a semiconductor device mounted on the circuit board and the first via; and
a second common wiring pattern connecting the semiconductor device and the second via.

11. A semiconductor module, comprising:
a memory device configured to store data;
a controller configured to control the memory device;
a circuit board on which the memory device and the controller are mounted; and
a first differential signal transmission circuit formed on the circuit board to connect the controller and the memory device, the first differential signal transmission circuit including a plurality of input wiring patterns and a plurality of complementary wiring patterns, alternately arranged on an upper surface and a lower surface of an insulating layer, wherein:
the plurality of input wiring patterns are connected to a common input wiring pattern at opposite ends of the first differential signal transmission circuit,
the plurality of complementary wiring patterns are connected to a common complementary wiring pattern at the opposite ends of the first differential signal transmission circuit, and
wherein, among the plurality of input wiring patterns and the plurality of complementary wiring patterns, line widths of wiring patterns on the upper surface of the insulating layer are different from line widths of wiring patterns on the lower surface of the insulating layer.

12. The semiconductor module as claimed in claim 11, wherein:
at one end of the first differential signal transmission circuit, the common input wiring pattern and the common complementary wiring pattern are connected to the controller, and
at another end of the first differential signal transmission circuit, the common input wiring pattern and the common complementary wiring pattern are connected to the memory device.

13. The semiconductor module as claimed in claim 12, wherein the controller outputs a clock signal to the common input wiring pattern and outputs a complementary signal of the clock signal to the common complementary wiring pattern, to transmit a differential clock signal to the memory device.

14. The semiconductor module as claimed in claim 11, wherein the line widths of the wiring patterns disposed on the lower surface of the insulating layer are wider than the line widths of the wiring patterns disposed on the upper surface of the insulating layer.

* * * * *